United States Patent [19]

Shimizu et al.

[11] Patent Number: 4,922,063
[45] Date of Patent: May 1, 1990

[54] ELECTRIC DATA SWITCH THAT SELECTS DATA BY MOVING ALONG TRACKS OF ELECTRODES

[75] Inventors: Seiji Shimizu; Tuyoshi Nagae, both of Nagoya, Japan

[73] Assignee: Brother Kogyo Kabushiki Kaisha, Aichi, Japan

[21] Appl. No.: 321,286

[22] Filed: Mar. 9, 1989

[30] Foreign Application Priority Data

Mar. 15, 1988 [JP] Japan .............................. 63-34270[U]

[51] Int. Cl.⁵ ........................ H01H 19/58; H01H 9/00
[52] U.S. Cl. ............................. 200/11 R; 200/11 DA; 200/11 G; 200/16 D; 200/292
[58] Field of Search ............. 200/11 R, 11 DA, 11 D, 200/11 G, 11 K, 16 C, 16 D, 292, 275, 11 TW

[56] References Cited

U.S. PATENT DOCUMENTS

| | | |
|---|---|---|
| 3,261,928 | 7/1966 | Schlesinger, Jr. ............ 200/16 DX |
| 4,038,504 | 7/1977 | McAnulty et al. ........... 200/11 DA |
| 4,135,065 | 1/1979 | Nicot .............................. 200/11 DA |
| 4,152,565 | 5/1979 | Rose ............................... 200/292 X |
| 4,728,755 | 3/1988 | Fowler et al. ................. 200/11 DA |

FOREIGN PATENT DOCUMENTS 53-49308 11/1978 Japan .

Primary Examiner—J. R. Scott
Attorney, Agent, or Firm—Oliff & Berridge

[57] ABSTRACT

An electric data switch, e.g., a rotary switch, that selects data by moving contact portion along tracks of electrodes, in which a contact portion touches two or more electrodes simultaneously, and in which leads between terminals of the electrodes are arranged to avoid touching with the contact portion. This simplifies the switch, allowing it to be smaller and more durable.

8 Claims, 3 Drawing Sheets

ELECTRIC DATA SWITCH THAT SELECTS DATA BY MOVING ALONG TRACKS OF ELECTRODES

BACKGROUND OF THE INVENTION

1. Field of the Invention

Our invention is an electric switch that selects data by moving contacts along tracks of electrodes such as a rotary type switch having a switch rotor mounted to or with respect to a printed circuit board.

2. Prior Art

Many data switches in this field are known. One example, disclosed in the Japanese Published Examined Utility Model Application No. 53-49308 and shown in FIG. 3, is rotated to a data selection position, and selects the data at that position when a read button (not shown) is pressed. This switch has a contact base 55 with several contacts 55a-55g. The contacts 55a-55g are arranged to correspond to concentric annular electrodes 52a-52g printed on a printed circuit board 51. Each of the electrodes 52a-52g has terminals 53 that can be touched by one of the contacts 55a-55g. The terminals 53 for each electrode 52a-52g are connected by narrower leads 54 that the contacts 55a-55g cannot touch. The contacts 55a-55g slide in unison over the electrodes 52a-55g when the switch is rotated. The contacts 55a-55g are electrically interconnected.

In FIG. 3, the contacts 55a-55g rest on the printed circuit board 51 at the hatched squares. In this example, four contacts 55a, 55c, 55e and 55f touch four electrodes 52a, 52c, 52e and 52f, respectively, thus conducting signal current. Three contacts 55b, 55d and 55g do not touch any of electrodes 52a-52g, and thus conduct no signal current. As a result, the switch, at this position, would read "0110101", where the innermost electrode 52a represents the least significant bit.

In this arrangement, the electrodes 52a-52g are so narrow that attempts to miniaturize the switch leave little margin for error. The contacts 55a-55g have to be made so small that the manufacturing process becomes very complex and expensive, while the strength of the contacts 55a-55g declines allowing greater deterioration during use.

SUMMARY OF THE INVENTION

Our invention permits an electric data switch that is strong and compact, yet simple and inexpensive to manufacture. To achieve this, in our invention, the contacts and the electrodes are arranged so that a contact can touch more than one electrode without touching any intervening leads.

DETAILED DESCRIPTION OF THE PREFERRED EMBODIMENTS

Figure 1:
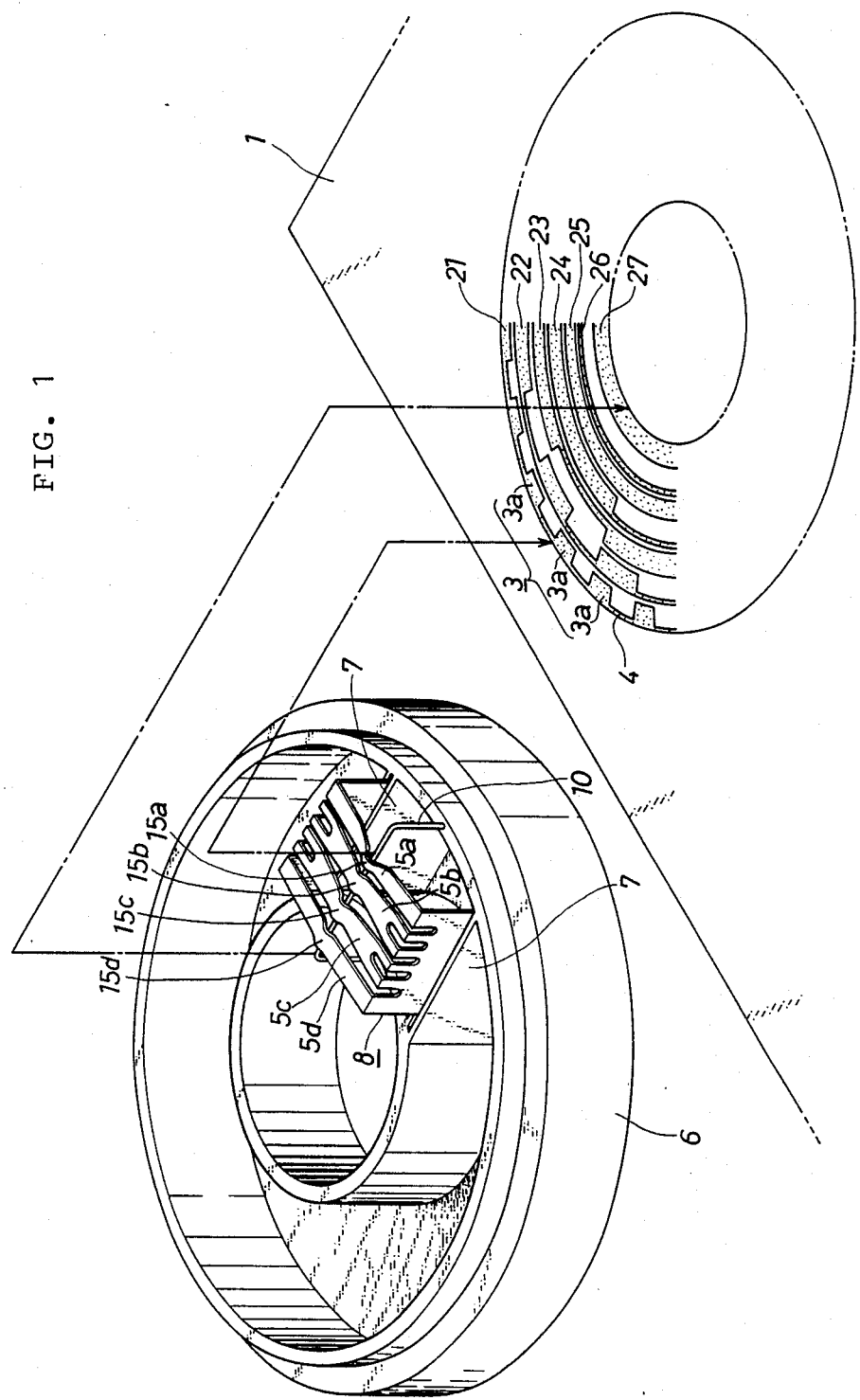
FIG. 1 shows a partially exploded view of our electric data switch.

FIG. 1 shows a printed circuit board 1 separated from a rotary switch rotor 6 with both parts facing up. Characters or symbols (not shown) indicating selection positions could be printed on ordinarily exposed surfaces of the switch rotor 6. To transmit data, a user rotates the switch rotor 6 to a selected position and presses a read button (not shown) in the center of the switch rotor 6.

Figure 2:
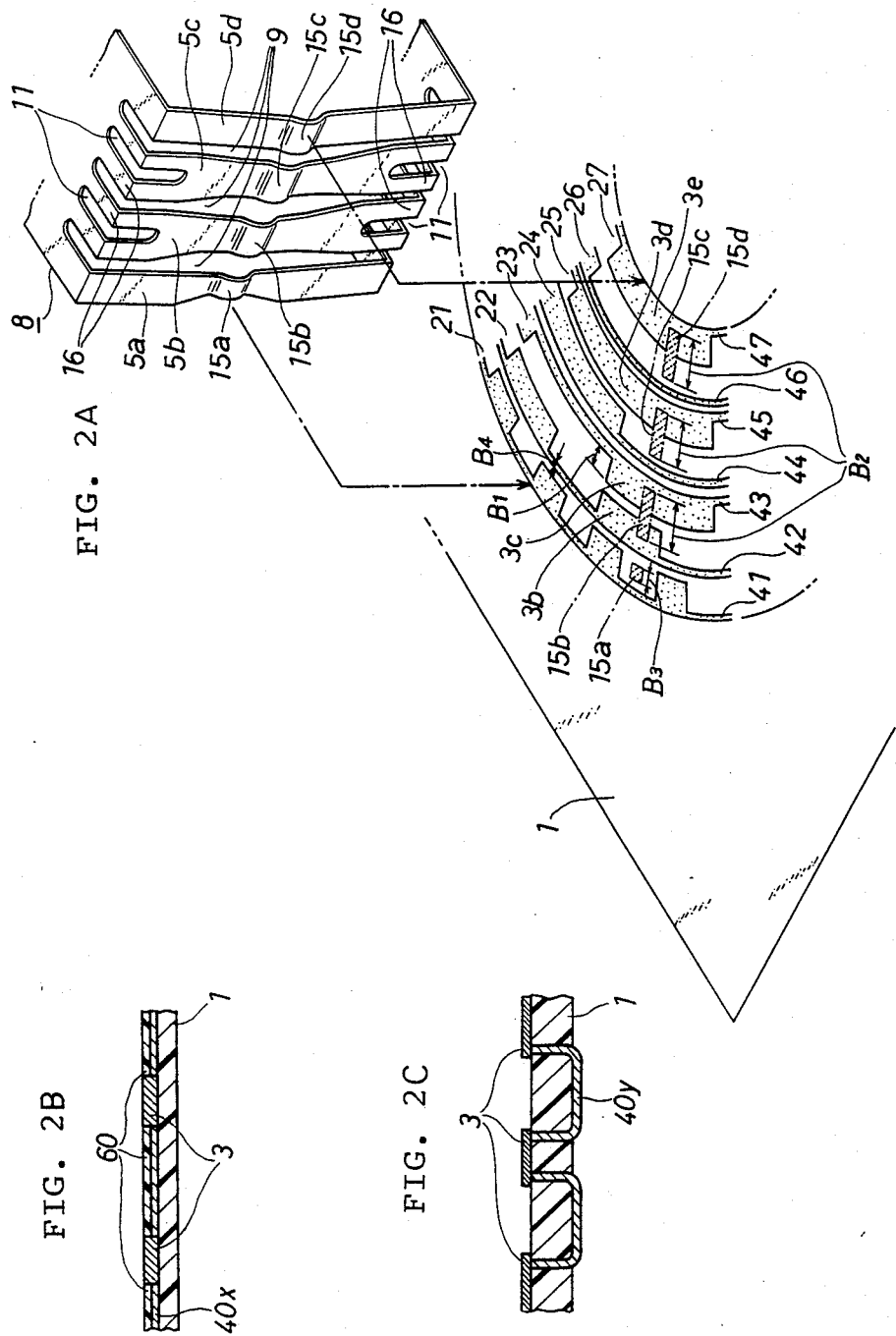
FIG. 2A shows how the contacts touch the electrodes.
FIG. 2B shows a second embodiment with insulated leads.
FIG. 2C shows a third embodiment with the leads placed on the back side of the circuit board.
Figure 3:
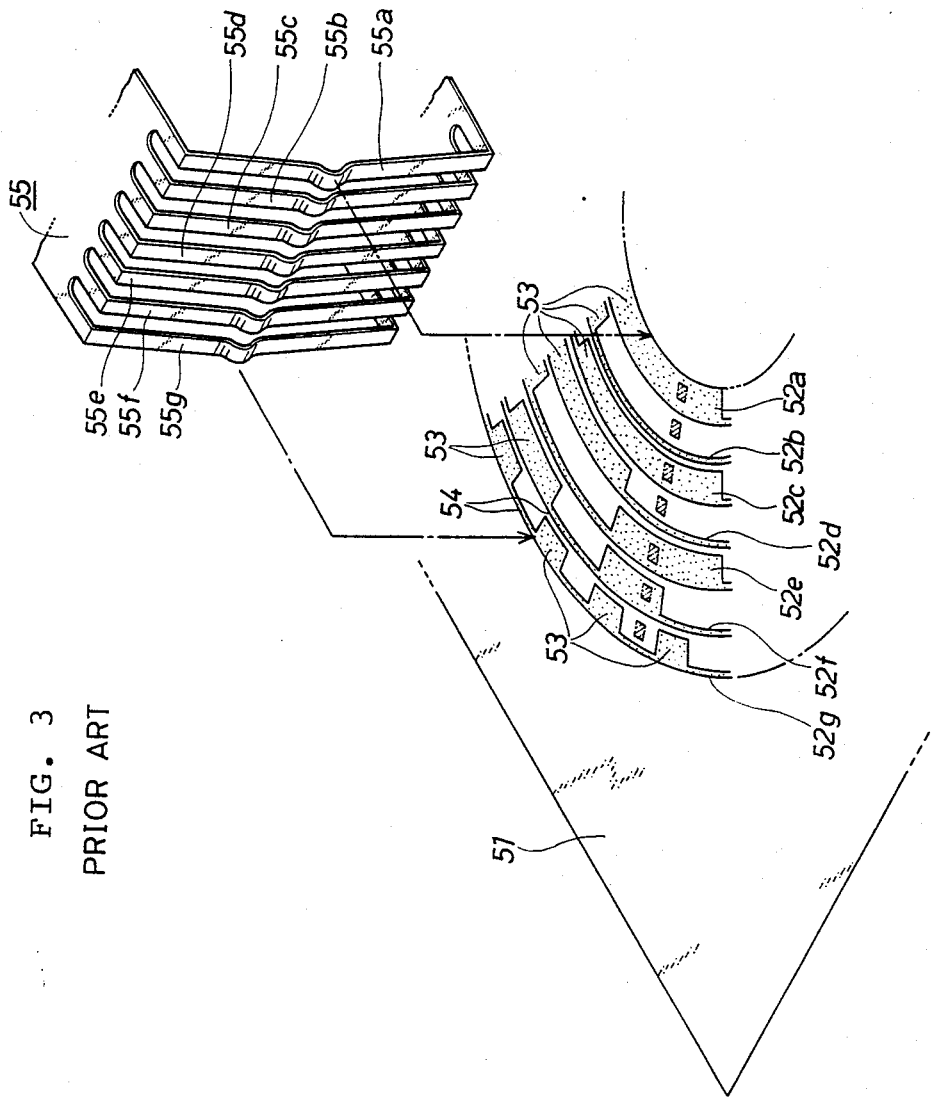
FIG. 3 shows the prior-art data selection switch.

Seven electrodes 21-27 are arranged in concentric loops on the circuit board 1 with a small gap between the electrodes 21-27 to insulate them from each other. Each electrode 21-27 has a varying pattern of terminals 3a connected by leads 4. As shown in FIG. 2A, adjacent electrodes 22-27 are paired, excluding the lone outermost electrode 21 since seven is an odd number. The leads 42-47 for each pair 22 and 23, 24 and 25, 26 and 27 are arranged away from each other, thus maximizing the distance between leads 42-47.

The contact base (movable contact in the illustrated embodiment) 8 has three slits 9 separating four contact portions 5a-5d. The center of each contact portions 5a-5d has a node 15a-15d that rests on the circuit board 1. As shown in FIG. 1, two braces 7 hold the contact base 8 in the switch rotor 6. The nodes 15a-15d are supported by a spring bar 10. The middle contact portions 5b and 5c have additional slits 11 at the corners 16 of the contact base 8 to enhance the resilience of those contact portions 5b and 5c against the printed circuit board 1.

The width B2 of the nodes 15b-15d corresponding to the paired electrodes 22 and 23, 24 and 25, 26 and 27 can be nearly twice the width B1 of a single electrode 21-27. The distance between the midpoints of those nodes 15b-15d is also approximately double the electrode width B1. The distance between the outermost node 15a and the adjacent node 15b is slightly less than one-and-a-half times the electrode width B1. The width B3 of the outermost node 15a is less than the electrode width B1.

The switch rotor 6 rotates along the concentric loops of electrodes 21-27. The nodes 15a-15d cross the electrodes 21-27 as indicated by the hatched rectangles in FIG. 2A. Thus, the outermost node 15a conducts current to the outermost electrode 21, and the other nodes 15b-15d conduct current to their corresponding pair of electrodes 22 and 23, 24 and 25, 26 and 27, respectively. The nodes 15a-15d and leads 41-47 are arranged so they cannot touch each other. This arrangement permits larger, stronger contacts 5a-5d, hence manufacturing this switch is simpler and less expensive.

The contact base 8 supplies high-state voltage to all the contact portions 5a-5d, but only those electrodes 21-27 actually touching a node 15a-15d receive that voltage. Thus, in FIG. 2A, four electrodes 22, 23, 25 and 27 receive high-state voltage while three electrodes 21, 24 and 26 do not receive any voltage, so the switch would read "0110101", where the innermost electrode 27 represents the least significant bit, just as the prior-art switch would.

Other variations are possible. FIG. 2B shows a second embodiment where a node (not shown) can touch more than two terminals 3 because insulation 60 covers the intervening leads 40x. Insulation 60 over the leads 40x would have to be friction-resistant. A third embodiment, shown in FIG. 2C, shields the leads 40y by placing them on the back side of the printed circuit board 1.

Also, other electrode 21-27 and contact portion 5a-5d configurations are possible. For instance, the electrodes 21-27 could be linear. The electrodes 21-27 and contact portions 5a-5d could be laid out in three dimensions. Also, the printed circuit board 1 could move relative to the switch rotor 6 instead of vice versa. Indeed, many configurations that allow selective contact between the nodes 5a-5b and the electrodes 21-27 are possible.

These embodiments are merely illustrations of our invention and do not limit the scope of our invention. Our invention is limited only by the following claims.

We claim:

1. An electric switch for selecting data, comprising:
    a contact base having at least one contact portion, said contact base being mounted to a member, said contact base being located adjacent at least one printed circuit board for movement relative thereto; and
    electrodes printed on said at least one printed circuit board, said at least one contact portion being movable along said electrodes upon relative movement between said circuit board and contact base, each electrode having a plurality of terminals connected by leads that are arranged to avoid touching any said contact portion upon movement of said at least one contact portion along said electrodes;
    said at least one contact portion being arranged to conduct current to at least two of said plurality of terminals of said electrodes by touching said at least two terminals simultaneously.

2. An electric switch according to claim 1, in which
    the electrodes are arranged into plural adjacent groups;
    the leads for each group are arranged on the peripheries of the group; and
    the contact base has plural contact portions, each of which conducts current to one of said group.

3. An electric switch according to claim 1, in which the leads are electrically insulated from the contact portion.

4. An electric switch according to claim 1, in which the leads are located on the back of the at least one printed circuit board.

5. An electric switch according to claim 1, in which the electrodes are arranged as concentric loops, and the contact base moves around the loops.

6. An electric switch according to claim 2, in which the electrodes are arranged as concentric loops, and the contact base moves around the loops.

7. An electric switch according to claim 3, in which the electrodes are arranged as concentric loops, and the contact base moves around the loops.

8. An electric switch according to claim 4, in which the electrodes are arranged as concentric loops, and the contact base moves around the loops.

* * * * *